United States Patent
Maeda

(10) Patent No.: US 7,886,178 B2
(45) Date of Patent: Feb. 8, 2011

(54) SEMICONDUCTOR MEMORY APPARATUS

(75) Inventor: Naoto Maeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 518 days.

(21) Appl. No.: 12/042,907

(22) Filed: Mar. 5, 2008

(65) Prior Publication Data
US 2008/0218227 A1    Sep. 11, 2008

(30) Foreign Application Priority Data
Mar. 7, 2007    (JP) ............... 2007-057252

(51) Int. Cl.
G06F 1/04 (2006.01)
G01R 23/00 (2006.01)
H03L 7/06 (2006.01)

(52) U.S. Cl. .......... 713/503; 327/156; 324/76.52

(58) Field of Classification Search ......... 713/401, 713/503; 714/718; 324/76.52, 76.53, 76.54; 327/156, 157, 158
See application file for complete search history.

(56) References Cited

U.S. PATENT DOCUMENTS

| | | | |
|---|---|---|---|
| 5,675,274 A * | 10/1997 | Kobayashi et al. | 327/158 |
| 5,717,353 A * | 2/1998 | Fujimoto | 327/276 |
| 6,678,205 B2 | 1/2004 | Johnson et al. | |
| 6,978,402 B2 * | 12/2005 | Hirabayashi | 714/42 |
| 7,123,001 B2 * | 10/2006 | Loke et al. | 324/76.54 |
| 7,750,618 B1 * | 7/2010 | Fang et al. | 324/76.41 |
| 2003/0038619 A1 * | 2/2003 | Boateng | 324/76.53 |
| 2004/0061488 A1 * | 4/2004 | Rosenbaum et al. | 324/76.53 |
| 2004/0100294 A1 * | 5/2004 | Toner | 324/760 |
| 2004/0161070 A1 * | 8/2004 | Yin et al. | 375/371 |

(Continued)

FOREIGN PATENT DOCUMENTS

JP    2005-102120 A    4/2005

(Continued)

OTHER PUBLICATIONS

An All-Analog Multiphase Delay-Locked Loop Using a Replica Delay Line for Wide-Range Operation and Low-Jitter Performance, IEEE Journal of Solid State Circuits, vol. 35, No. 3, Mar. 2000.*

(Continued)

Primary Examiner—Khanh Dang
(74) Attorney, Agent, or Firm—Foley & Lardner LLP

(57) ABSTRACT

In order to provide a semiconductor memory apparatus which can adjust the locked loop circuit such as a DLL in detail after producing the semiconductor memory apparatus, and moreover, which can adjust the locked loop circuit by using a measuring apparatus which has a low testing frequency, an exclusive-OR circuit generates an adjusting clock signal TCLK obtained by multiplying a frequency of a pair of test clock signals which respectively have a phase difference. A DLL circuit inputs the adjusting clock signal TCLK in place to an external clock signal CLK. The counter circuit counts the control clock signal CCLK outputted from the DLL circuit for a predetermined time. A comparator compares a counted value to an expected value and outputs a comparison result. A phase adjusting circuit outputs an adjusting signal to a delay circuit inside the DLL circuit based on the comparison result outputted from the comparator, and adjusts a phase of the control clock signal CCLK outputted from the DLL circuit.

4 Claims, 3 Drawing Sheets

U.S. PATENT DOCUMENTS

| | | | |
|---|---|---|---|
| 2004/0263146 A1* | 12/2004 | Boerstler et al. | 324/76.53 |
| 2006/0066291 A1* | 3/2006 | Kakizawa et al. | 324/76.54 |
| 2007/0096785 A1* | 5/2007 | Maeda | 327/158 |
| 2008/0082871 A1* | 4/2008 | Chung et al. | 714/719 |
| 2008/0238504 A1* | 10/2008 | Kwon | 327/156 |
| 2008/0246461 A1* | 10/2008 | Abuhamdeh et al. | 324/76.54 |
| 2010/0039157 A1* | 2/2010 | Kaeriyama et al. | 327/292 |
| 2010/0134162 A1* | 6/2010 | Kondou | 327/157 |

FOREIGN PATENT DOCUMENTS

| | | | |
|---|---|---|---|
| JP | 2005-514721 A | 5/2005 | |

OTHER PUBLICATIONS

Designing, Simulating, and Testing an Analog Phase-Locked Loop in a Digital Environment, Hewlett-Packard Journal, Apr. 1997.*

* cited by examiner

FIG. 2A  TEST MODE ENABLE SIGNAL TEST
FIG. 2B  INPUT A (CLOCK SIGNAL A)
FIG. 2C  INPUT B (CLOCK SIGNAL B)
FIG. 2D  TCLK (ADJUSTING CLOCK SIGNAL)
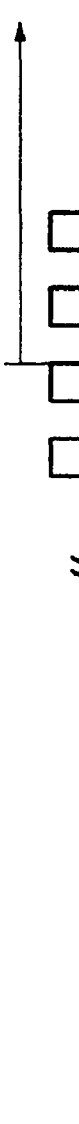
FIG. 2E  CONTROL CLOCK SIGNAL CCLK (INTERNAL CLK)
FIG. 2F  RESET SIGNAL

EXPECTED CONTROL CLOCK

EXAMPLE OF INCORRECT CONTROL CLOCK SIGNAL

SEMICONDUCTOR MEMORY APPARATUS

BACKGROUND OF THE INVENTION

1. Field of the Invention

The present invention relates to a semiconductor memory apparatus. In particular, the present invention relates to a semiconductor memory apparatus that can adjust a locked loop circuit (DLL (delay-locked loop circuit), PLL (phase-locked loop circuit) and the like) which has functions of generating and adjusting internal clock signals (control clock inside the semiconductor memory apparatus) so as to work at a desired or requested frequency, even if a measuring apparatus is used which has a low operating frequency (frequency used for testing).

Priority is claimed on Japanese Patent Application No. 2007-57252, filed Mar. 7, 2007, the content of which is incorporated herein by reference.

2. Description of the Related Art

In general, an integrated circuit such as SDRAM (synchronous dynamic random access memory), which is a synchronous type, and which inputs an input signal and outputs an output signal while being synchronized with an external clock signal, can work at a high speed. The integrated circuit apparatus inputs/outputs signals while being synchronized with a rising edge of the external clock signal. Therefore, with regard to a high speed semiconductor memory apparatus such as DRAM (dynamic random access memory), there has been a proposal of providing a self-timing control circuit.

The self-timing control circuit is constituted from a locked loop circuit such as DLL (Delays-Locked Loop) or PLL (Phase-Locked Loop). By applying the locked loop circuit, it is possible to generate an inside clock signal (control clock) with stable frequency and phase without being affected by temperature, production process, changes of electric power, and the like (for example, see Patent Documents 1 and 2).

However, a conventional integrated circuit apparatus has a problem. In the problem, it has been difficult to maintain an operational margin of an analog circuit (such as a portion of a delay circuit) of the DLL circuit and the like along with progress of a lower voltage, fineness of a production process and operational speed in recent years, and along with dispersion of VT (voltage thresholds). Therefore, the problem is that, in order to produce the semiconductor circuit apparatus which stably and reliably works, it is necessary to set an allowable range of produced products (allowable range of dispersion of products compared to design specifications) narrow or small.

With regard to such a problem, it is generally known that if it is possible to adjust the analog circuit in detail after producing, it is possible to set the allowable range of produced products and to produce the products which stably and reliably work. Therefore, there has been a desire and demand for adjusting the locked loop circuit in detail after producing the semiconductor memory apparatus.

On the other hand, it has been understood that in order to adjust the locked loop circuit in detail after producing the semiconductor memory apparatus, a fuse-cut (a method of setting a detailed adjusting circuit by applying anti-fuse or the like) in a wafer testing step is effective. However, in general, an apparatus is used which is operated at a slow speed in the wafer testing step. Therefore, there has been a problem in which it was impossible to adjust the locked loop circuits such as DLL and PLL circuits which work at a clock of a high frequency. Therefore, there has been a demand for a solution which can adjust and test operations of the locked loop circuit (DLL circuit or PLL circuit) at a predetermined or desired frequency even if a measuring apparatus is used which has a low operating frequency.

[Patent Document 1] Published Japanese Translation No. 2005-514721 of PCT International Publication

[Patent Document 2] Japanese Unexamined Patent Application, First Publication No. 2005-102120

As described above, there has been a demand for a solution which can adjust the locked loop circuit in detail after producing the semiconductor memory apparatus.

Moreover, there has been a demand for a solution which can adjust the locked loop circuit by using a measuring apparatus which has a low operating frequency (testing frequency).

SUMMARY OF THE INVETION

The present invention is conceived in order to solve the above-described problems. The present invention has an objective of providing a semiconductor memory apparatus in which it is possible to adjust the locked loop circuit (DLL and the like) in detail after producing the semiconductor memory apparatus, and moreover, it is possible to adjust the locked loop circuit by using a measuring apparatus which has a low operating frequency (testing frequency).

The present invention is conceived in order to solve the above-described problems. The present invention provides, for example, the following aspects.

A first aspect of the present invention is, for example, a semiconductor memory apparatus, including: a locked loop circuit adjusting and outputting a phase of a control clock signal which is an internal clock signal in order to synchronize with an external clock signal inputted from outside; a test clock signal input unit inputting two or more test clock signals which have lower frequencies than the external clock signal and which respectively have different phases; an adjusting clock signal generation unit which generates an adjusting clock signal obtained by multiplying a frequency of the test clock signal; a test mode selecting unit selecting the adjusting clock signal as an input to the locked loop circuit instead of the external clock signal in order to test the locked loop circuit; a counting unit which counts the control clock outputted from the locked loop circuit for a predetermined time if the locked loop circuit inputs the adjusting clock signal which is selected by the test mode selecting unit; a comparing unit which compares a counted value obtained by the counting unit to a predetermined expected value; and a phase adjusting unit which adjusts a phase of the control clock signal outputted from the locked loop circuit based on a comparison result between the counted value and the expected value obtained by the comparing unit.

In accordance with the above-described semiconductor memory apparatus, in order to adjust a phase of the locked loop circuit, the adjusting clock signal is generated which has a frequency obtained by multiplying a frequency of multiple test clock signals that have respectively different phases, and the locked loop circuit inputs the adjusting clock signal in place to the external clock signal.

Moreover, the counting unit counts the control clock signal outputted from the locked loop circuit for a predetermined time, the comparing unit compares the counted value to the predetermined expected value, and the phase adjusting unit adjusts a phase of the control clock signal outputted from the locked loop circuit based on the comparison result.

Therefore, it is possible to adjust a phase of the control clock signal outputted from the locked loop circuit (DLL and the like) in detail after producing the semiconductor memory apparatus, and moreover, it is possible to adjust the locked loop circuit by using a measuring apparatus which has a low operating frequency (testing frequency).

Moreover, a second aspect of the present invention is preferably the above-described semiconductor memory apparatus, wherein a counting operation of the control clock signal conducted by the counting unit, a comparing operation between the counted value and the expected value conducted by the comparing unit and a phase adjusting operation of the control signal outputted from the locked loop circuit conducted by the phase adjusting unit are repeated until the comparison result of the comparing unit indicates that the counted value and the expected value are the same or substantially the same.

In accordance with the above-described semiconductor memory apparatus, the counting operation of the control clock signal, and the comparing operation between the counted value and the expected value and the phase adjusting operation of the control clock signal are repeated.

Therefore, it is possible to adjust a phase of the control clock signal outputted from the locked loop circuit (DLL and the like) in detail after producing the semiconductor memory apparatus, and moreover, it is possible to adjust the locked loop circuit by using a measuring apparatus which has a low operating frequency (testing frequency).

A third aspect of the present invention is preferably the above-described semiconductor memory apparatus, wherein the test clock signals are a pair of signals which have the same frequency and which have a 90° difference of phases, and the adjusting clock signal generation unit is an exclusive-OR circuit which inputs the pair of the test signals and which outputs the adjusting clock signal.

In accordance with the semiconductor memory apparatus of the above-described constitution in which the adjusting signals of the locked loop circuit are generated as clock signals with phases respectively having a 90° difference, it is possible to generate the adjusting clock signal with less difficulties, and moreover, it is possible to adjust the locked loop circuit (such as DLL) by using a measuring apparatus which has a low operating frequency (testing frequency).

A fourth aspect of the present invention is preferably the above-described semiconductor memory apparatus wherein the locked loop circuit is a delay-locked loop circuit (DLL).

In accordance with the semiconductor memory apparatus of the above-described constitution in which the locked loop circuit is constituted from a DLL, it is possible to adjust the DLL in detail after producing the semiconductor memory apparatus, and moreover, it is possible to adjust DLL by using a measuring apparatus which has a low operation frequency (testing frequency).

In accordance with the above-described aspects, it is possible to adjust the locked loop circuit (DLL, PLL, and the like) in detail even by using a measuring apparatus which has a low operating frequency, and it is possible to correctly adjust a phase of the internal clock signal (control clock signal).

A high-speed DRAM, and the like in recent years includes an internal clock generating circuit (control clock generating circuit) to which a locked loop circuit (DLL, and the like) is applied in order to achieve highly accurate input/output timing. By applying the locked loop circuit, it is possible to generate an inside clock signal with stable frequency and phase without being affected by temperature, production process, changes of electric power, and the like. However, there is a problem in which there is a difference between the phase of the internal clock signal and a predetermined value because of a dispersion caused upon producing a product after designing.

In accordance with the above-described aspects, it is possible to detect whether or not the clock signal is accurate even by using a measuring apparatus which has a low operating frequency, and moreover, it is possible to adjust the locked loop circuit (DLL and the like) in order to accurately adjust the control clock signal.

BRIEF DESCRIPTION OF THE DRAWINGS

FIG. 2A is a drawing which shows an example of a generated clock signal.

FIG. 2B is a drawing which shows an example of a generated clock signal.

FIG. 2C is a drawing which shows an example of a generated clock signal.

FIG. 2D is a drawing which shows an example of a generated clock signal.

FIG. 2E is a drawing which shows an example of a generated clock signal.

FIG. 2F is a drawing which shows an example of a generated clock signal.

DETAILED DESCRIPTION OF THE INVENTION

Hereinafter, one embodiment as an example of the present invention is explained in reference to the drawings.

Figure 1:
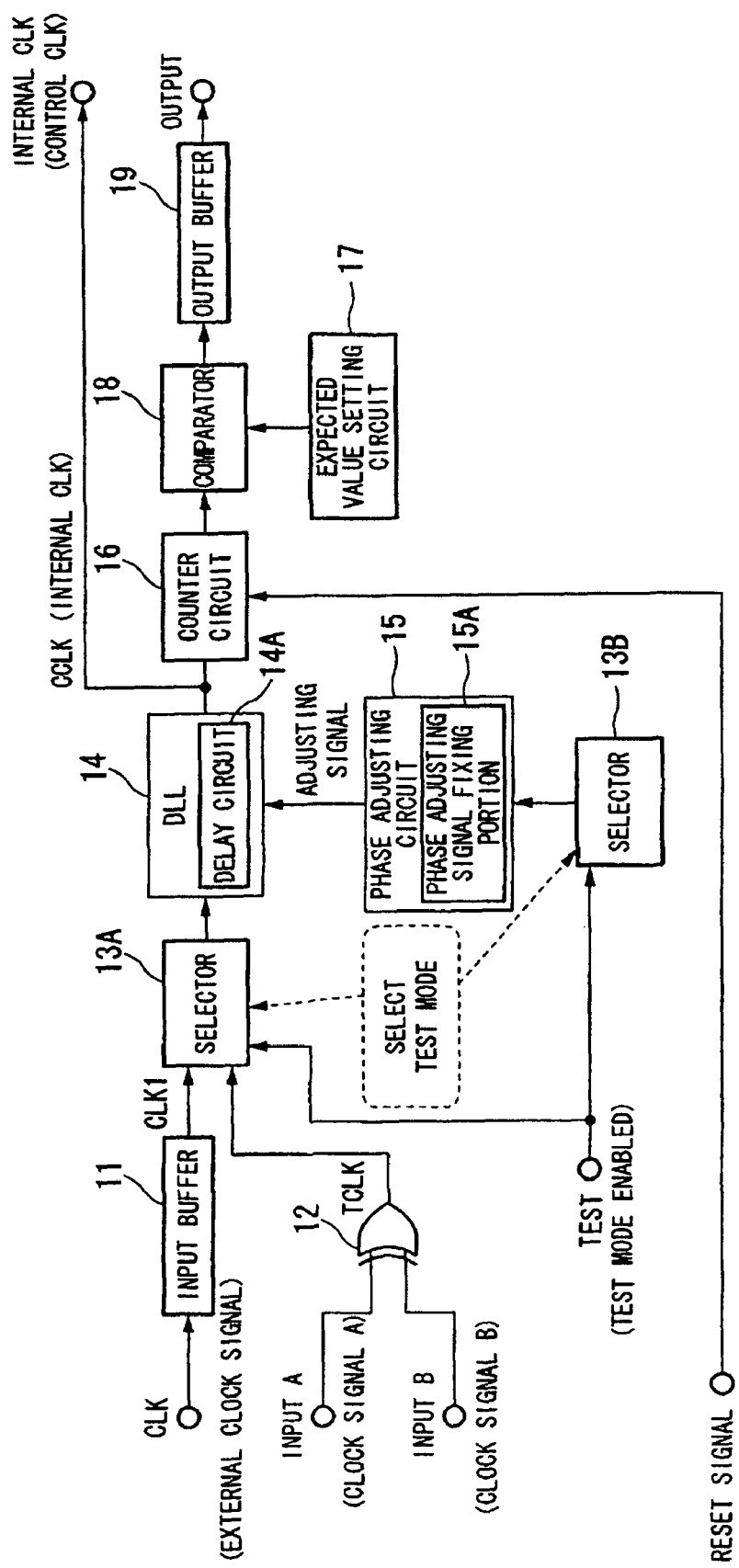
FIG. 1 is a drawing which shows a constitution of a semiconductor memory apparatus of one embodiment.

FIG. 1 is a drawing which shows a constitution of a semiconductor memory apparatus of this embodiment FIG. 1 shows an example in which a DLL (Delay-Locked Loop) is used as a locked loop circuit.

In FIG. 1, an input buffer 10 inputs an external clock signal CLK which is supplied to a DLL circuit 14 from outside. The input buffer 10 generates a clock signal CLK1 by regenerating a waveform of the external clock signal CLK.

An exclusive-OR circuit (EXOR) 12 inputs a clock signal A from an input terminal A and a clock signal B from an input terminal B. The clock signals A and B have the same frequency f and have phases which have a 90° phase shift to each other. The exclusive-OR circuit (EXOR) 12 outputs an adjustment clock signal TCLK which has a frequency of 2f obtained by being doubled.

Selectors 13A and 13B are circuits for switching the internal circuit to a test mode when the DLL circuit 14 is in a test mode (a mode in which a phase of a control clock signal CCLK is adjusted). In the case of the test mode, the selector 13A switches from the clock signal CLK 1 to the adjusting clock signal TCLK which is supplied to the DLL circuit 14. The selector 13B activates a phase adjusting circuit 15 in the case of the test mode.

It should be noted that the DLL circuit 14 has a generally known constitution including such as a VCDL (Voltage Controlled Delay Line).

The phase adjusting circuit 15 can adjust the phase of control clock signals CCLK (internal CLK) outputted from the DLL circuit 14 by adjusting such as delays of the delay line inside the DLL circuit 14. A counter circuit 16 counts the control clock signals (CCLK) outputted from the DLL circuit 14. An expected value of the counted value obtained by the counter circuit 16 is set to an expected value setting circuit 17 beforehand. A comparator 18 compares between the counted value of the counter circuit 16 and the expected value set in the expected value setting circuit 17. An output buffer 19 inputs and maintains a comparison result outputted from the comparator 18.

It should be noted that the clock signals A and B correspond to the above-described test clock signal, and the clock signal TCLK clock signal corresponds to the above-described adjusting clock signal. Moreover, the exclusive-OR circuit 12 corresponds to the above-described adjusting clock signal generation unit, the selectors 13A and 13B correspond to the above-described test mode selecting unit, the DLL circuit 14 corresponds to the above-described locked loop circuit, the counter circuit 16 corresponds to the above-described counter unit, the phase adjusting circuit 15 corresponds to the above-described phase adjusting unit, and the comparator 18 corresponds to the above-described comparing unit.

FIGS. 2A-F are drawings which show examples of generating clock signals.

In FIGS. 2A-F, the adjusting clock signal TCLK shown in FIG. 2D has a doubled frequency, and is generated from both a clock signal A shown in FIG. 2B and a clock signal B shown in FIG. 2C.

If a test mode (a phase adjusting mode of the control clock signal CCLK) is activated, that is, if a test mode enable signal shown in FIG. 2A is "H" (High), the DLL circuit 14 outputs the internal CLK signal (control clock signal CLK) shown in FIG. 2E. After that, the counter circuit 16 inputs a reset signal shown in FIG. 2F and resets a counted value of the counter circuit 16, and the counter circuit 16 starts counting the control clock signals CCLK. The counter circuit 16 continues counting for a predetermined time.

Here, for example, such a test mode enable signal "H" shown in FIG. 2A can be input from an external test apparatus which is provided for testing the semiconductor memory apparatus. In addition, in a similar manner, a reset signal shown in FIG. 2F can be input from an external test apparatus which is provided for testing the semiconductor memory apparatus.

An adjusting operation of the DLL circuit 14 in the above-described constitution is explained below.

First, the test mode is started at the selectors 13A and 13B by activating the test enable signal (TEST). Moreover, as described above, clock signals are inputted from the input terminals A and B. It is possible to generate clocks which have a higher frequency because there is a gap between the inputted clock signals input from the input terminals A and B and because the exclusive-OR circuit (EXOR) 12, and the like are applied. For example, as shown in FIG. 2, in order to generate an adjusting clock signal TCLK which has a doubled frequency, a clock signal A (B) is applied to the input terminal A (B), and the clock signal A has a 90° difference of phase from the signal B.

The DLL circuit 14 inputs the adjusting clock signal TCLK generated from both the clock signals A and B, and the phase adjusting circuit 15 adjusts a phase (delay) of a control clock signal CCLK outputted from the DLL circuit 14 so as to be adjusted to have a predetermined timing.

In order to adjust a phase of the control clock signal CCLK outputted from the DDL circuit 14 by using the phase adjusting circuit 15, the counter circuit 16 inputs the control clock signal CCLK generated by the DDL circuit 14 and counts the control clock signal CCLK for a predetermined time.

Next, the comparator 18 compares the counted value obtained by the counter circuit 16 to an expected value set at the expected value setting circuit 17, and outputs the comparison result to the outside via the output buffer 19. If the comparison result outputted from the output buffer 19 is correctly and appropriately adjusted (both the expected value and the counted value are the same or substantially the same values), it is recognized that the semiconductor memory apparatus is correctly and appropriately adjusted. In such a case, it is not necessary to adjust the DLL circuit 14.

If the comparison result outputted from the output buffer 19 is not correctly and appropriately adjusted (both the expected value and the counted value are not the same), the adjusting signal outputted to the DLL circuit 14 from the phase adjusting circuit 15 is enabled (activated), and the phase (delay) of the delay circuit portion 14A inside the DLL circuit 14 is adjusted. It should be noted that the delay circuit portion 14A is, for example, constituted from a voltage control and delay circuit (VCDL).

With regard to such a delayed phase adjusting operation, in accordance with a constitution of the delay circuit portion 14A inside the DLL circuit 14 (for example, in accordance with a constitution of VCDL), a volume of adjusting a phase is determined beforehand which is a predetermined unit, and the phase adjusting circuit 15 outputs an adjusting signal to the delay circuit portion 14A inside the DLL circuit 14 in order to adjust a phase (delay) inside the delay circuit portion 14A based on the comparison result (which is larger between the counted value and the expected value) of the comparator 18.

In accordance with such an operation, the phase adjusting circuit 15 outputs the adjusting signal to the delay circuit portion 14A inside the DLL circuit 14, that is, the phase adjusting circuit 15 repeats both adjustments of the delay circuit 14A and confirmations of adjusted results obtained by the comparator 18 in order to determine an appropriate state of adjusting signals at the delay circuit 14A inside the DLL circuit 14.

After conducting the above-described adjusting steps, if it is possible to determine an appropriate state of adjusting signals at the delay circuit portion 14A inside the DLL circuit 14, in order to fix the appropriate state of the adjusting signals, a fuse (such as an anti-fuse) which is provided for fixing the phase adjusting signals is cut inside the phase adjusting signal fixing portion 15A of the phase adjusting circuit 15.

Figure 3A:
FIG. 3A is a drawing which shows an example of an expected clock signal.
Figure 3B:
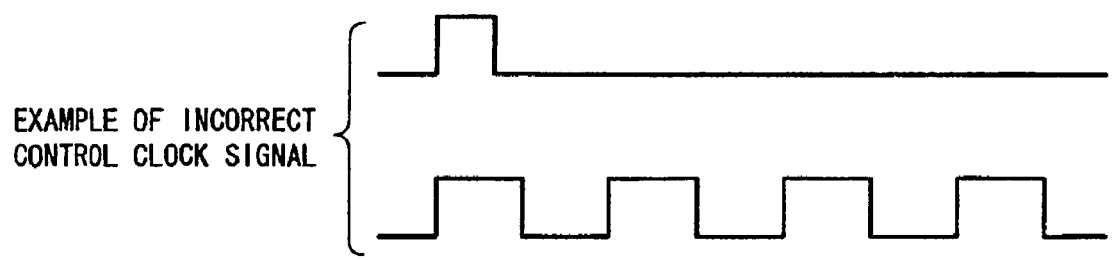
FIG. 3B is a drawing which shows an example of an incorrect clock signal.

It should be noted that FIGS. 3A and 3B are drawings which show correct and incorrect examples of the control signal CLK. A clock signal (control clock signal) shown in FIG. 3A is an expected clock signal, and a clock signal (control clock signal) shown in FIG. 3B is a wrong clock signal.

If the control clock signal is a clock signal as shown in FIG. 3B, a phase (delay) of the delay circuit portion 14A inside the DLL circuit 14 is adjusted in order to obtain the clock signal as shown in FIG. 3A.

As described above, in accordance with the semiconductor memory apparatus of the present invention, it is possible to detect whether or not the clock signal generated by a locked loop circuit (such as DLL) is accurate even by using a measuring apparatus which has a low operating frequency, and moreover, it is possible to accurately adjust a phase of the control clock signal outputted from the locked loop circuit.

It should be noted that the above description is an example of using a DLL as a locked loop circuit, and moreover, it is possible to apply the idea of the present invention to a case of using a PLL.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor memory apparatus, comprising:
a locked loop circuit adjusting and outputting a phase of a control clock signal which is an internal clock signal in order to synchronize with an external clock signal inputted from outside;
a test clock signal input unit inputting two or more test clock signals which have lower frequencies than the external clock signal and which respectively have a difference of phases;
an adjusting clock signal generation unit which generates an adjusting clock signal obtained by multiplying a frequency of the test clock signal;
a test mode selecting unit selecting the adjusting clock signal as an input to the locked loop circuit instead of the external clock signal in order to test the locked loop circuit;
a counting unit which counts the control clock outputted from the locked loop circuit for a predetermined time if the locked loop circuit inputs the adjusting clock signal which is selected by the test mode selecting unit;
a comparing unit which compares a counted value obtained by the counting unit to a predetermined expected value; and
a phase adjusting unit which adjusts a phase of the control clock signal outputted from the locked loop circuit based on a comparison result between the counted value and the expected value obtained by the comparing unit.

2. A semiconductor memory apparatus according to claim 1, wherein a counting operation of the control clock signal conducted by the counting unit, a comparing operation between the counted value and the expected value conducted by the comparing unit and a phase adjusting operation of the control signal outputted from the locked loop circuit conducted by the phase adjusting unit are repeated until the comparison result of the comparing unit indicates that the counted value and the expected value are the same or substantially the same.

3. A semiconductor memory apparatus according to claim 1, wherein
the test clock signals are a pair of signals which have the same frequency and which have a 90° difference of phases, and
the adjusting clock signal generation unit is an exclusive-OR circuit which inputs the pair of the test signals and which outputs the adjusting clock signal.

4. A semiconductor memory apparatus according to claim 1, wherein the locked loop circuit is a delay-locked loop circuit (DLL).

* * * * *